United States Patent [19]
Koyama

[11] Patent Number: 5,985,751
[45] Date of Patent: Nov. 16, 1999

[54] PROCESS FOR FABRICATING INTERCONNECTION OF SEMICONDUCTOR DEVICE

[75] Inventor: Kazuhide Koyama, Kanagawa, Japan

[73] Assignee: Sony Corporation, Japan

[21] Appl. No.: 08/568,667

[22] Filed: Dec. 7, 1995

[30] Foreign Application Priority Data

Dec. 16, 1994 [JP] Japan .............................. P06-334242

[51] Int. Cl.⁶ .............................................. H01L 21/4763
[52] U.S. Cl. .......................... 438/637; 438/632; 438/634; 438/648
[58] Field of Search .............................. 437/40, 193, 194, 437/225; 438/639, 642, 647, 648, 649, 643, 626, 627, 632, 635, 629

[56] References Cited

U.S. PATENT DOCUMENTS

| | | | |
|---|---|---|---|
| 5,591,671 | 1/1997 | Kim et al. ............................... | 438/643 |
| 5,610,099 | 3/1997 | Stevens et al. .......................... | 438/626 |
| 5,747,361 | 5/1998 | Ouellet .................................... | 438/643 |

*Primary Examiner*—Charles Bowers
*Assistant Examiner*—Renee' R. Berry
*Attorney, Agent, or Firm*—Rader, Fishman & Grauer; Ronald P. Kananen

[57] ABSTRACT

A process for fabricating interconnection of a semiconductor device is provided which allows the physical vapor deposition and reflow treatment to be performed in different apparatuses and requires no surface treatment prior to the reflow treatment. The process comprises the steps of forming a metallic interconnection material layer on a substrate by means of physical vapor deposition using a metallic interconnection material; forming an oxidation preventive film on the metallic interconnection material layer; subjecting the metallic interconnection material layer to reflow treatment to form a complete solid solution of the components constituting the oxidation preventive film with those of the metallic interconnection material layer; and patterning the metallic interconnection material layer to form an interconnection.

9 Claims, 7 Drawing Sheets

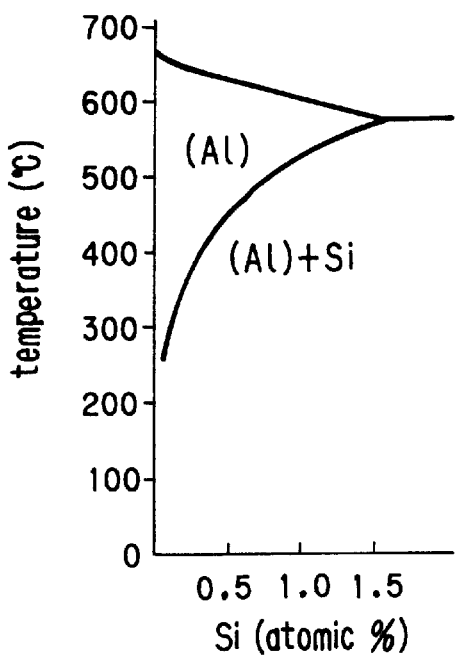
FIG.8A Al-Si
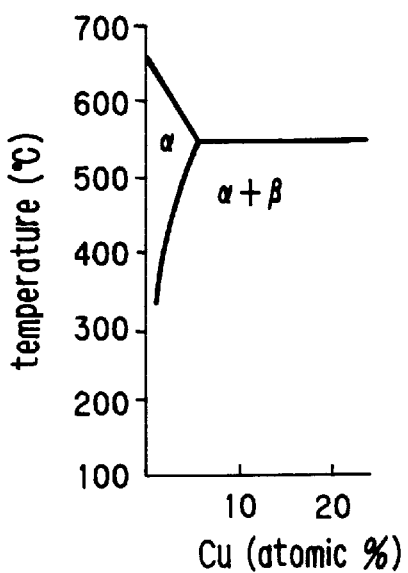
FIG.8B Al-Cu
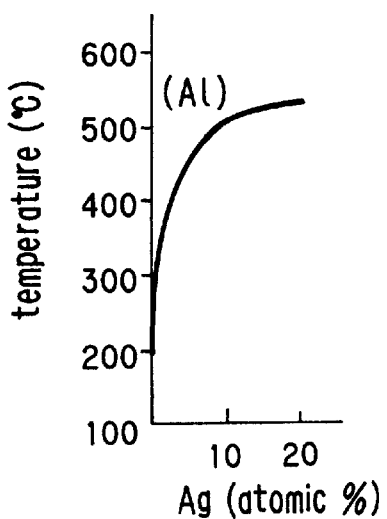
FIG.8C Al-Ag
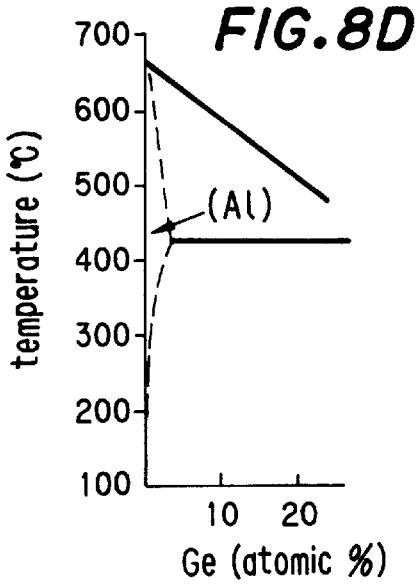
FIG.8D Al-Ge

5,985,751

PROCESS FOR FABRICATING INTERCONNECTION OF SEMICONDUCTOR DEVICE

BACKGROUND OF THE INVENTION

The present invention relates to a process for fabricating interconnection of a semiconductor device based on physical vapor deposition (PVD) and a so-called high temperature reflow process.

With increasing demand for more highly integrated semiconductor devices, finer size rules are required. In the process for fabricating interconnections of semiconductor devices, the technology for forming narrower and deeper (i.e., higher aspect ratio) contact holes, via holes, and through holes (referred to collectively hereinafter as "connection holes") is highly estimated as the key of the device fabrication process. A connection hole can be formed by, for instance, providing an aperture portion in the insulating layer formed on the upper side of a conductive layer, and then filling the aperture portion with a metallic interconnection material. In case of depositing a film of a metallic interconnection material by sputtering an aluminum (Al) based alloy on an insulating film with an aperture portion formed therein, no sputtered aluminum-based alloy particles are found incident on the portion shielded by the side wall of the aperture portion. This phenomenon is known as a so-called shadowing effect. Thus, an aperture portion with inferior aluminum-based alloy coverage remains as a result. This induces a problematic device failure such as disconnection in the vicinity of the bottom portion of the aperture where less aluminum based alloy is deposited. It is therefore required to establish a process technology to surely fill the aperture portion with a metallic interconnection material.

High temperature aluminum reflow process is proposed as the process technology to meet the demand above. The process comprises depositing an aluminum based alloy on the insulating film by means of sputtering, and then applying heat treatment thereto to fill the aperture portion with the flow of the aluminum based alloy. To fill the aperture portion with the aluminum based alloy by applying high temperature aluminum reflow treatment, the aluminum based alloy is heated in a temperature range not lower than the recrystallization temperature (although depending on the composition of the alloy, it is generally 350° C. or higher) but not higher than the melting point thereof. In this manner, the aluminum based alloy film deposited on the insulating layer is fluidized and then settles inside the aperture portion to give an aperture portion filled with the aluminum based alloy. To prevent the surface of the aluminum based alloy from being oxidized and to favorably introduce the flow of the alloy into the aperture portion, preferably, the film deposition of the aluminum based alloy and the reflow treatment thereof are performed inside a same film deposition apparatus without exposing the aluminum based alloy to air.

In some cases of high temperature aluminum reflow treatment, furthermore, high pressure is applied under an inert gas atmosphere during reflow treatment in order to achieve an aperture portion more favorably filled with an aluminum based alloy and to lower the reflow temperature. This type of reflow treatment is referred to hereinafter as a "high pressure reflow treatment". Also in this process, the flow of the alloy can be more favorably introduced into the aperture portion by performing the film deposition of the aluminum based alloy and the reflow treatment thereof inside a same film deposition apparatus without exposing the aluminum based alloy to air.

A schematically drawn partial cross sectional view of a semiconductor substrate and the like subjected to film deposition of an aluminum based alloy and to reflow treatment in the same film deposition apparatus without exposing the aluminum based alloy to air is shown in FIGS. 1(A) and 1(B). FIG. 2 shows a schematically drawn partial sectional view of another semiconductor substrate and the like that is exposed to air after depositing the aluminum based alloy and then subjected to reflow treatment. In the figures, it can be seen that the semiconductor substrate indicated by reference numeral 130 comprises thereon an element isolating region 131, a gate electrode 133, a source/drain region 135, an insulating layer 140 formed on the surface of the semiconductor substrate 130, an aperture portion 136 formed on the insulating layer 140, a so-called adhesive layer 141, and an aluminum based alloy layer 142. FIG. 1(A) is a schematically drawn partial cross sectional view of the structure obtained after depositing the aluminum based alloy layer 142 on the surface of the insulating layer 140. FIG. 1(B) shows a schematically drawn partial cross sectional view of the structure obtained after reflow treatment.

Referring to FIG. 2, voids tend to generate in the bottom portion of the aperture portion 136 when reflow treatment is effected after depositing the aluminum based alloy which is further exposed to air, because the aluminum alloy subjected to reflow treatment flows into the aperture portion 136 only insufficiently. Thus, it is necessary to deposit the aluminum based alloy and to perform the reflow treatment in a same film deposition apparatus. To perform the treatment above in a single film deposition apparatus, however, a clustered equipment comprising both the film deposition chamber and the reflow (or the high pressure reflow) treatment chamber is necessary. Such a film deposition apparatus is too expensive, and the use of such an apparatus leads to the increase in cost of production.

In addition, when the reflow treatment is carried out in a separated apparatus after depositing the aluminum based alloy, a cleaning process becomes necessary immediately before the reflow treatment in order to remove an oxidized film formed on the surface of the aluminum based alloy layer 142 by means such as sputter-etching. However, carrying out the cleaning process and the reflow treatment in the same apparatus requires an expensive apparatus that leads to increased production cost.

Accordingly, an object of the present invention is to provide a process for fabricating an interconnection for a semiconductor device in which, for instance, deposition of a metallic interconnection material such as an aluminum based alloy by means of physical vapor deposition and the reflow treatment thereafter are performed without using the same film deposition apparatus, and the metallic interconnection material is subjected to reflow treatment without previous surface treatment.

SUMMARY OF THE INVENTION

According to a first aspect of the present invention, there is provided a process for fabricating interconnection of a semiconductor device, comprising the steps of: forming a metallic interconnection material layer on a substrate by means of physical vapor deposition using a metallic interconnection material, forming an oxidation preventive film on the metallic interconnection material layer, subjecting the metallic interconnection material layer to reflow treatment to form a complete solid solution of the components constituting the oxidation preventive film with those of the metallic interconnection material layer, and patterning the metallic interconnection material layer to form an interconnection.

In the process for fabricating an interconnection for a semiconductor device according to the first aspect of the present invention, the process further comprises a step of exposing the semiconductor device to air between the step of forming the oxidation protective film on the metallic interconnection material layer and the step of subjecting the metallic interconnection material layer to reflow treatment.

The substrate for use in the process for fabricating an interconnection for a semiconductor device according to the first aspect of the present invention includes, for instance, a semiconductor substrate having an insulating layer formed on the surface thereof. Connection holes such as contact holes, via holes, or through holes, may be formed on the insulating layer so that they are electrically connected to interconnections.

According to a second aspect of the present invention, there is provided a process for fabricating interconnection of a semiconductor device, which process forms an interconnection comprising a metallic interconnection material layer and a connection hole filled with the metallic interconnection material constituting the metallic interconnection material layer. The process is characterized in that it comprises the steps of: forming an insulating layer on a substrate having a conductive layer provided thereon, and forming an aperture portion in the insulating layer provided on the conductive layer, forming a metallic interconnection material layer on the insulating layer by means of physical vapor deposition, forming an oxidation preventive film on the metallic interconnection material layer, subjecting the metallic interconnection material layer to reflow treatment to form a complete solid solution of the components constituting the oxidation preventive film with those of the metallic interconnection material layer, and filling the aperture portion with the metallic interconnection material to form a connection hole, and patterning the metallic interconnection material layer to form an interconnection.

The conductive layer above includes a source or drain region formed on a semiconductor substrate, or an interconnection layer provided on the insulating layer provided on a semiconductor substrate.

The process for fabricating an interconnection for a semiconductor device according to the second aspect of the present invention may also include an embodiment in which the aperture portion retains avoid at the bottom portion thereof and is plugged by the metallic interconnection material layer at the upper portion thereof after the step of forming the metallic interconnection material layer by means of physical vapor deposition, and in which the step of subjecting the metallic interconnection material layer to the reflow treatment is carried out under a high pressure.

Furthermore, the process according to the second aspect of the present invention may also comprise the step of exposing the semiconductor device to air between the step of forming the oxidation protective film on the metallic interconnection material layer and the step of subjecting the metallic interconnection material layer to reflow treatment.

In the process for fabricating an interconnection for a semiconductor device according to the first or the second aspect of the present invention, the oxidation preventive film is made of a material incapable of easily forming a tough oxide film at room temperature, and is provided with a film thickness corresponding to a thickness for including quantities of the components constituting the oxidation preventive film not more than the limit of completely dissolving into the metallic interconnection material to form solid solution by the reflow treatment of the metallic interconnection material layer. More specifically, the "material incapable of easily forming a tough oxide film at room temperature" as referred herein is a material whose components constituting the oxidation preventive film completely dissolve into the metallic interconnection material to form a solid solution therewith when the metallic interconnection material layer is subjected to reflow treatment, and which does not leave the oxide preventive film or the oxidized film thereof on the metallic interconnection material layer.

The oxide preventive film must completely dissolve into the metallic interconnection material at the reflow temperature which is a temperature of the metallic interconnection material layer when the layer is subjected to reflow treatment, and yet, it must not be readily oxidized. Preferably, it is made of at least one material selected from the group consisting of silver (Ag), copper (Cu), silicon (Si), and germanium (Ge). Preferred metallic interconnection materials include pure aluminum, copper, and various types of aluminum alloys such as an Al—Cu alloy, an Al—Si alloy, an Al—Si—Cu alloy, Al—Ge alloy, or an Al—Si—Ge alloy.

In the process according to the present invention, the components constituting the oxidation preventive film are completely dissolved into the metallic interconnection material by subjecting the metallic interconnection material layer to reflow treatment. More specifically, for example, a primary solid solution comprising the metallic interconnection material as the solvent (atoms) and the components constituting the oxidation preventive film as the solute (atoms) is formed. The reflow temperature depends on the composition of the metallic interconnection material and that of the oxidation preventive film, however, it is set at a temperature not lower than the temperature at which the components constituting the oxidation preventive film completely dissolve into the metallic interconnection material (i.e., a temperature not lower than that for forming the primary solid solution), but not higher than the eutectic point of the system consisting of the components constituting the oxidation preventive film and the metallic interconnection material (in case an aluminum-alloy based metallic interconnection material and an silicon-based oxidation preventive film are used, for instance, the upper limit is set at the eutectic point of 577° C. or lower, at which the partial melting occurs).

Methods of physical vapor deposition as referred herein include evaporation, or various types of sputtering processes such as magnetron sputtering, DC sputtering, RF sputtering, ECR sputtering, bias sputtering comprising applying a bias voltage to the substrate, or a combination of two or more selected therefrom.

In the process according to the present invention, the components constituting the oxidation preventive film are completely dissolved in the metallic interconnection material during the reflow treatment of the metallic interconnection material layer. After the reflow treatment of the metallic interconnection material layer, the oxidation preventive film does not remain on the surface of the metallic interconnection material layer. Accordingly, the oxidation preventive film have no negative effects on the later fabrication steps and on the semiconductor device that is obtained as the final product. Moreover, because an oxidation preventive film is formed on the surface of the metallic interconnection material layer before the reflow treatment, the surface oxidation of the metallic interconnection material layer can be prevented from occurring even if the semiconductor device is exposed to air. Thus, the process can be performed without using a special film deposition apparatus comprising a clustered equipment comprising the film deposition chamber and the reflow (or high pressure reflow) treatment chamber, and without removing the oxide film formed on the surface of the metallic interconnection material layer before subjecting the layer to reflow treatment.

If no voids remain at the bottom of the aperture portion and if the upper side of the aperture portion is left unplugged by the metallic interconnection material layer as shown in FIG. 3, it becomes difficult to form an oxidation preventive film on the surface of the metallic interconnection material layer provided inside the aperture portion. Thus, in the process for fabricating an interconnection for a semiconductor device according to the second aspect of the present invention, the formation of an oxidation preventive film on the surface of the metallic interconnection material layer can be assured by depositing the metallic interconnection material layer in such a manner that voids remain at the bottom of the aperture portion and that the upper side of the aperture portion is plugged. However, when the metallic interconnection material layer is deposited in this manner, it is sometimes found difficult to fill the voids in the bottom of the aperture portion with the metallic interconnection material. In such cases, the metallic interconnection material layer is subjected to reflow treatment under a high pressure to surely fill the voids located at the bottom of the aperture portion with the metallic interconnection material.

BRIEF DESCRIPTION OF THE DRAWINGS

FIGS. 8(A) to 8(D) are a diagram showing binary system phase equilibria for alloys.

DETAILED DESCRIPTION OF THE INVENTION

The present invention is described in further detail below by making reference to preferred embodiments and drawings. It should be understood, however, that the present invention is not to be construed as being limited to the embodiments below.

First Embodiment 1

Figure 4A:
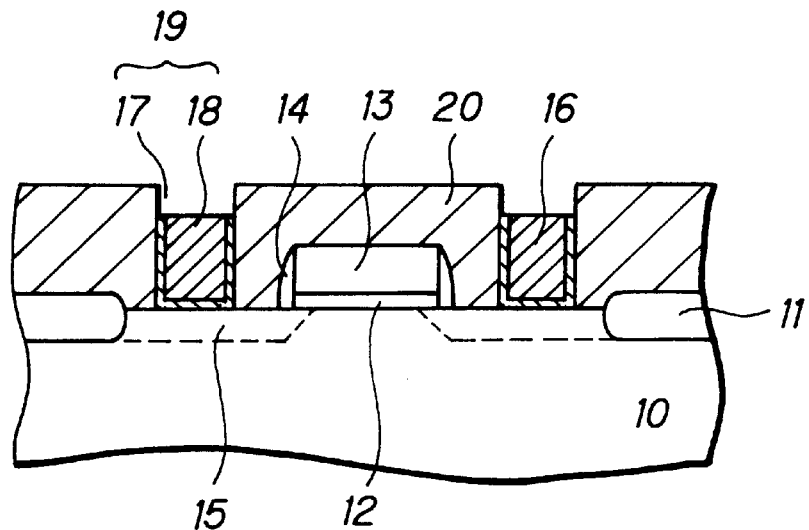
FIGS. 4(A) and 4(B) are a diagram showing the process steps for fabricating an interconnection for a semiconductor device according to an embodiment of the present invention.
Figure 4B:
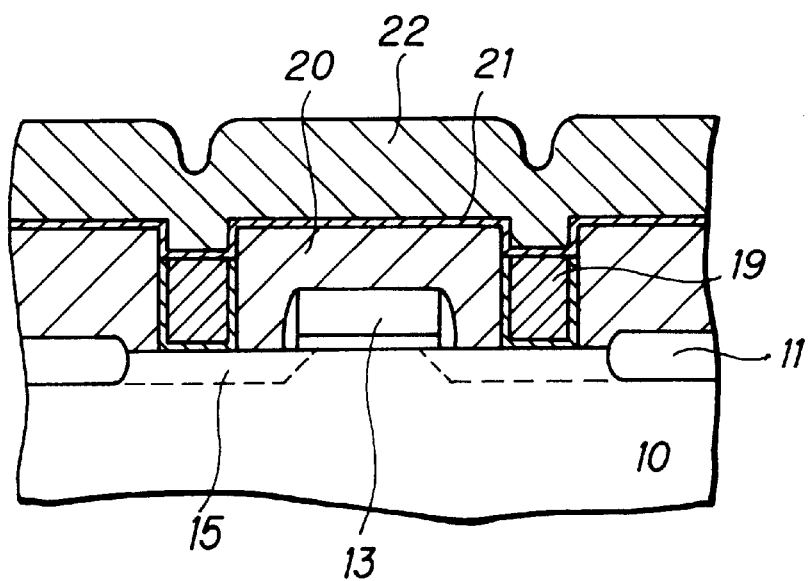

The first embodiment refers to a process for fabricating an interconnection for a semiconductor device according to a first aspect of the present invention. DC sputtering is used as a method of physical vapor deposition. The metallic interconnection material comprises an Al-0.5%Cu alloy, and amorphous silicon is used for the oxidation preventive film. In the first embodiment, the substrate comprises a semiconductor substrate 10 having an insulating layer 20 formed thereon. The process for fabricating an interconnection for a semiconductor device according to a first aspect of the present invention is described below with reference to FIGS. 4(A) and 4(B), and to FIGS. 5(A) and 5(B).

The semiconductor substrate 10 comprises an element isolating region 11 having a LOCOS structure or a trench structure, an $SiO_2$ gate oxide film 12, a gate electrode 13 made from polysilicon, polycide, or a silicide, an $SiO_2$ gate side wall 14 formed on the side wall of the gate electrode, and a source/drain region 15, each formed previously by a known process. The insulating layer 20 may comprise, for example, $SiO_2$, and can be formed by CVD. After forming the insulating layer 20 (which is sometimes referred to hereinafter to indicate the entire structure of the substrate 20), an aperture portion 16 located at the upper side of the source/drain region 15 is provided in the insulating layer 20.

A connection hole 19 is formed thereafter by filling the aperture portion 16 with a metal plug 18. The connection hole 19 can be formed in the following manner. First, a Ti layer and a TiN layer are formed consecutively on the insulating layer 20 inclusive of the aperture portion 16 by means of, for instance, sputtering. The Ti layer is provided for the purpose of lowering the contact resistance between the source/drain region 15 and the metal plug. Meanwhile, the TiN layer functions as a barrier layer which prevents the source/drain region 15 from being damaged by the metallic interconnection material when the aperture portion 16 is filled with the metallic interconnection material constituting the metal plug. The Ti layer and the TiN layer can be deposited by film deposition effected under the same conditions as those to be described hereinafter. After depositing the TiN layer, preferably, RTA (rapid thermal annealing) is performed at 650° C. for a duration of about 60 seconds under gaseous nitrogen or under a mixed gas atmosphere of nitrogen and oxygen. The function of the TiN layer as a barrier can be enhanced in this manner. The Ti layer and the TiN layer obtained through the process above is referred to collectively as a barrier metal layer 17. Then, a connection hole 19 is formed by effecting a so-called blanket tungsten CVD process to fill the aperture portion 16 with a metallic interconnection material comprising tungsten. More specifically, after depositing the tungsten metallic interconnection material by CVD on the insulating layer 20 inclusive of the inside of the aperture portion 16, the metallic interconnection material and the barrier metal layer 17 made of tungsten are etched back and removed from the insulating layer 20 to leave over the tungsten metal plug 18 and the barrier metal layer 17 inside the aperture portion 16. Thus is obtained the connection hole 19 (see FIG. 4(A)). By effecting etch back process, in general, the top face of the connection hole 19 is made to be located lower than the surface of the insulating layer 20. In the process above, blanket tungsten CVD is effected at a film deposition temperature of 450° C. by using a mixed gas flow of $WF_6$, $H_2$, and argon (Ar) with respective flow rates of 80, 500, and 2800 sccm under a pressure of $1.1 \times 10^5$ Pa. The etch back process is effected by using a mixed gas flow of $SF_6$ and Ar with respective flow rates of 110 and 80 sccm under a pressure of 35 Pa and by applying an RF power of 275 kW.

The constitution above is merely an example, and is not essential for the process of fabricating an interconnection for a semiconductor device according to the first aspect of the present invention. There may be cases in which no connection hole 19 is provided in the insulating layer 20, or in which a lower interconnection is provided at the bottom of the connection hole 19. The lower interconnection may be formed on the lower insulating layer, or, in other cases, it may be buried in the lower insulating layer.

The process of fabricating an interconnection for a semiconductor device according to a first aspect of the present invention is explained stepwise below.

Step 100

A metallic interconnection material layer 22 is formed on the surface of a substrate 20 comprising an insulating layer on the surface thereof. The layer 22 is deposited by means of physical vapor deposition (more specifically, by DC sputtering) using a metallic interconnection material. To improve wettability and adhesiveness of the metallic interconnection material comprising Al-0.5%Cu to the substrate 20, and to also provide redundancy to the interconnection so that the disconnection of the entire interconnection can be prevented from occurring in case of disconnection of the metallic interconnection material layer due to electromigration, stress migration, etc., a titanium underlayer 21 is preferably formed previously on the surface of the substrate 20 by means of sputtering. Then, the metallic interconnection material layer 22 made of Al-0.5%Cu is deposited on the surface of the underlayer 21 by DC sputtering (see FIG. 4(B)). The underlayer 21 is deposited at a film deposition temperature of 150° C. by flowing 100 sccm of gaseous Ar as the process gas under a pressure of 0.4 Pa and applying a DC power of 5 kW. The 0.5 $\mu$m thick metallic interconnection material layer 22 is deposited at a film deposition temperature of 150° C. by DC sputtering at a DC power of 10 kW using an Al-0.5%Cu target while flowing 100 sccm of gaseous Ar as the process gas under a pressure of 0.4 Pa.

Step 110

Figure 5A:
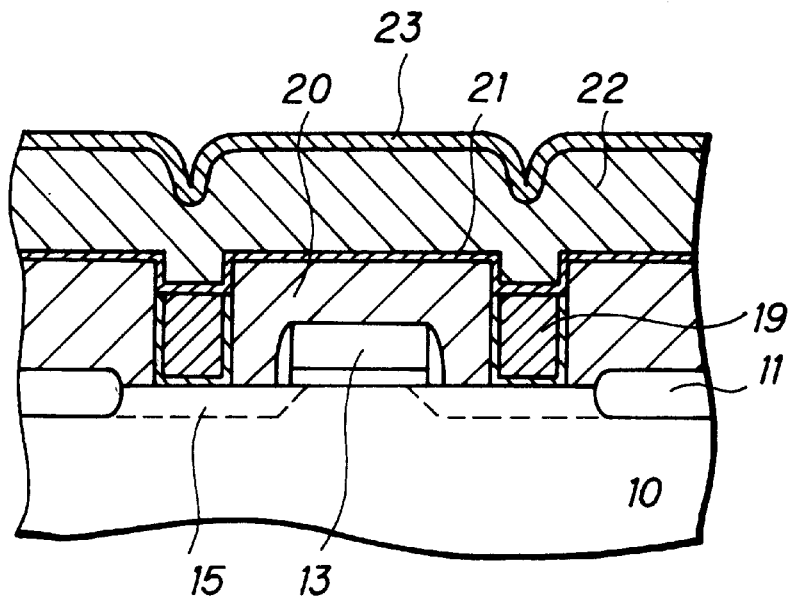
FIGS. 5(A) and 5(B) are a diagram showing the process steps successive to those illustrated in FIGS. 4(A) and 4(B), for fabricating an interconnection for a semiconductor device according to an embodiment of the present invention.
Figure 5B:
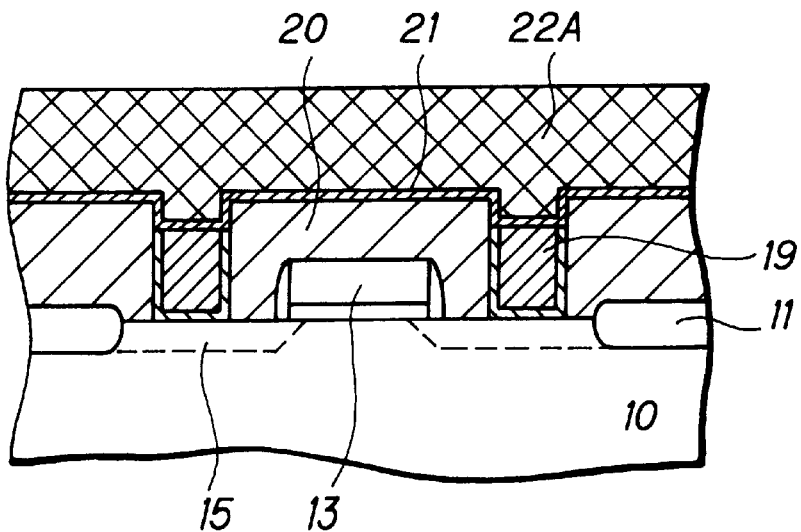

Then, in the same DC sputtering apparatus, an oxidation preventive film 23 is formed on the surface of the metallic interconnection material layer 22 without exposing the surface of the metallic interconnection material layer 22 to air (see FIG. 5(A)). In the first embodiment, amorphous silicon is used for the oxidation preventive film 23. The thickness of the amorphous silicon film is preferably set at a value corresponding to a thickness for including quantities of the components constituting the oxidation preventive film 23 not more than the limit of completely dissolving into the metallic interconnection material at the reflow temperature to form solid solution by the reflow treatment of the metallic interconnection material layer 22. In case the reflow temperature is 450° C., for instance, the oxidation preventive film 23 is provided at a thickness corresponding to about 0.5% of the thickness of the metallic interconnection material layer 22 made of Al-0.5%Cu (more specifically, for example, the thickness of the oxidation preventive film is 2.5 nm for the 0.5 $\mu$m thick metallic interconnection material layer 22). Here, the thickness corresponding to about 0.5% of the thickness of the metallic interconnection material layer 22 is the upper limit of completely dissolving the components of the oxidation preventive film 23 into the metallic interconnection material when the metallic interconnection material layer 22 is subjected to reflow treatment. An oxidation preventive film 23 provided even with such a thickness can effectively prevent the surface of the metallic interconnection material layer 22 from being oxidized. A 2 nm thick oxidation preventive film 23 is deposited by means of RF sputtering, for example, at a film deposition temperature of 150° C. by applying an RF power of 3 kW, while flowing 100 sccm of gaseous Ar as a process gas and maintaining the pressure at 0.4 Pa.

Step 120

The resulting semiconductor substrate is taken out of the sputtering apparatus thereafter, and the semiconductor device (which is actually an intermediate product) is exposed to air. Then, the semiconductor device is placed inside a separate apparatus specially designed for reflow treatment (a furnace, for example) to completely dissolve the components constituting the oxidation preventive film 23 into the metallic interconnection material by subjecting the metallic interconnection material layer 22 to reflow treatment (FIG. 5(B)). That is, a primary solid solution is formed which comprises Al as the solvent atoms and Si as the solute atoms. The metallic interconnection material layer into which the components constituting the oxidation preventive film 23 are completely dissolved is denoted by a reference numeral 22A. In this case, cleaning the surface of the metallic interconnection material layer 22 by effecting sputter etching and the like is unnecessary prior to reflow treatment. The reflow treatment is effected at a reflow temperature of 450° C. for a duration of 2 minutes while maintaining gaseous argon atmosphere at the atmospheric pressure or lower.

Optionally, back substrate gas heating type reflow treatment can be employed. This type of heating uses a heater block placed at the back side of the semiconductor substrate which is heated to a predetermined temperature (heating temperature), and an argon process gas is introduced between the heater block and the back side of the semiconductor substrate to heat the substrate. Other methods of heating including lamp heating may be applied.

Referring to the phase diagram for Al—Si system illustrated in FIG. 8(A), the reflow temperature must be set at a temperature not lower than about 440° C., at which 0.4% of silicon completely dissolves into the aluminum metallic interconnection material to form a solid solution, but not higher than the eutectic point 577° C. at which the metallic interconnection material may partially undergo melting. Although there is no particular limitations concerning the pressure of the reflow atmosphere, the reflow treatment is preferably effected under a high purity inert gas atmosphere so that the metallic interconnection layer may not be oxidized or nitridized during the treatment.

Step 130

Then, the metallic interconnection material layer 22 and the underlayer 21 provided on the insulating layer 20 are patterned by photolithography and etching to form an interconnection layer. The patterning is performed by applying an RF power of 1.2 kW while flowing a mixed gas of BCl$_3$ and Cl$_2$ with respective flow rate of 60 and 90 sccm at a pressure of 2 Pa.

Second Embodiment 2

Figure 6A:
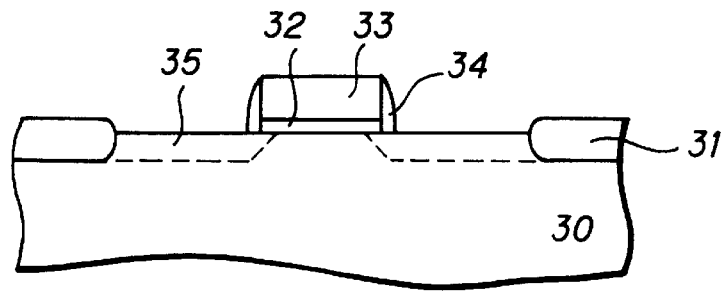
FIGS. 6(A) to 6(C) are a diagram showing the process steps for fabricating an interconnection for a semiconductor device according to another embodiment of the present invention.
Figure 6B:
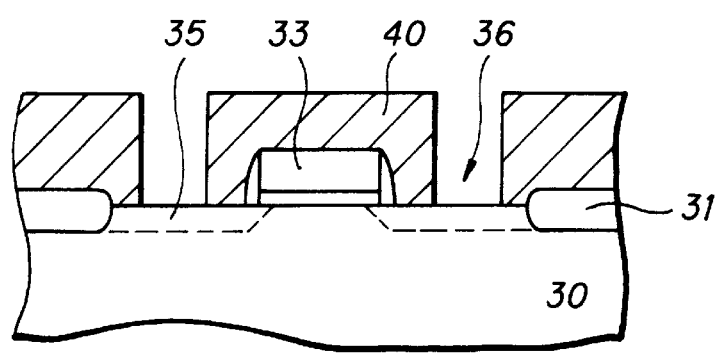

The second embodiment refers to a process for fabricating an interconnection for a semiconductor device according to a second aspect of the present invention. In the second embodiment, the substrate comprises a semiconductor substrate with a source/drain region as the conductive layer. DC sputtering is used as a method of physical vapor deposition. The metallic interconnection material comprises an Al-0.5%Cu alloy, and amorphous silicon is used for the oxidation preventive film. The process for fabricating an interconnection for a semiconductor device of the embodiment is described below with reference to FIGS. 6(A) to 6(C), and to FIGS. 7(A) and 7(B).

Step 200

An element isolating region 31 is formed on the surface of the silicon semiconductor substrate 30 according to a known process, and an $SiO_2$ gate oxide film 32 is formed on the surface of the silicon semiconductor substrate. A gate electrode 33 comprising polysilicon, polycide, or a silicide is formed thereafter by means of, for instance, CVD, photolithography, and etching. Then, after effecting ion implantation thereafter to form an LDD structure, an $SiO_2$ film is deposited over the entire surface, and the resulting $SiO_2$ film is etched back to form an $SiO_2$ side wall 34 on the side wall of the gate electrode 33. Ion implantation is effected thereafter, and annealing is performed to activate the impurities introduced into the substrate 30 by means of ion implantation. Thus is formed the source/drain regions. In this manner, a conductive layer 35 comprising source/drain regions is formed on the silicon semiconductor substrate 30 (FIG. 6(A)). Although a LOCOS structured element isolating region 31 is provided for the structure shown in FIG. 6(A), an element isolating region having the so-called trench structure can be employed as well.

Step 210

An insulating layer 40 is formed on the substrate 30 having the conductive layer 35 formed thereon. The insulating layer can be formed by means of CVD, and it comprises, for example, $SiO_2$. Then, by employing photolithography and etching, an aperture portion 36 is provided in the insulating layer 40 corresponding to the upper side of the conductive layer 35 (FIG. 6(B)).

Step 220

A Ti layer and a TiN layer are deposited consecutively on the insulating layer 40 inclusive of the inside of the aperture portion 36. The Ti layer is formed with an aim to lower the contact resistance between the conductive layer 35 and the metallic interconnection material to be formed later. The TiN layer functions as a barrier layer which prevents the conductive layer 35 from being damaged by the metallic interconnection material upon filling the aperture portion 36 with the metallic interconnection material. The Ti layer is deposited at a thickness of 30 nm by performing sputtering at a film deposition temperature of 150° C. by applying a DC power of 5 kW and flowing 100 sccm of argon as a process gas under a pressure of 0.4 Pa. The TiN layer is deposited to be 70 nm thick by sputtering at a film deposition temperature of 150° C., by applying a DC power of 5 kW and flowing a mixed gas of argon and nitrogen with respective flow rates of 30 and 80 sccm under a pressure of 0.4 Pa. To further enhance the barrier function of the TiN layer, preferably, RTA treatment is preferably effected on the TiN layer at 650° C. for a duration of about 60 seconds under gaseous nitrogen or in a mixed gas atmosphere comprising nitrogen and oxygen. Thus obtained Ti layer or the TiN layer is generally called as a barrier metal layer 41.

Step 230

Figure 6C:
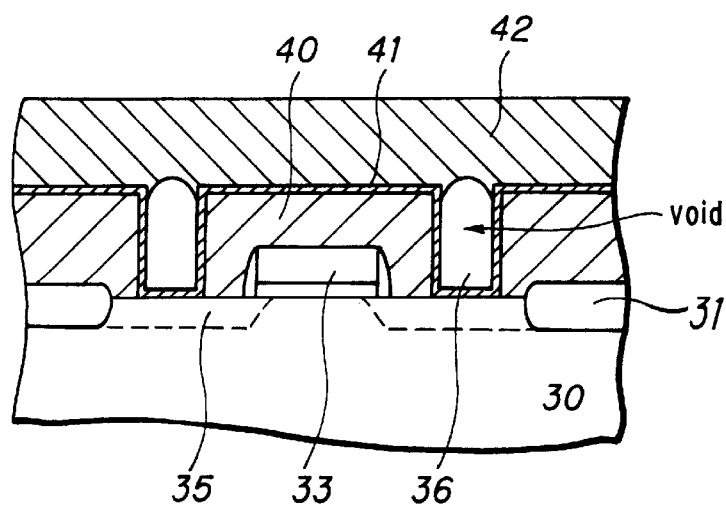

An Al-0.5%Cu metallic interconnection material layer 42 is deposited thereafter on the insulating layer 40 (more specifically, on the barrier metal layer 41 in case of the second embodiment) by means of physical vapor deposition (FIG. 6(C)). In the second embodiment, DC sputtering is used for the physical vapor deposition process. Prior to the deposition of the metallic interconnection material layer 42, a 20 nm thick Ti underlayer (not shown in the figure) is preferably deposited by means of sputtering on the barrier metal layer 41 to improve the wettability of the metallic interconnection material layer. Thus, a 0.5 μm thick metallic interconnection material layer 42 is deposited at a film deposition temperature of 300° C. by DC sputtering at a DC power of 20 kW using an Al-0.5%Cu target, while flowing 100 sccm of gaseous Ar as the process gas under a pressure of 0.4 Pa.

Thus deposited aluminum-based alloy metallic interconnection material layer 42 preferably has a bridge-like shape as is shown in FIG. 6(C). That is, voids preferably remain at the bottom of the aperture portion 36, and the upper side of the aperture portion 36 is plugged by the metallic interconnection material layer 42. If such a bridge-like shape is not attained, i.e., in case the metallic interconnection material layer is formed at a shape shown in FIG. 3, it becomes difficult to form an oxidation preventive film on the surface of the metallic interconnection material layer inside the aperture portion. To form a metallic interconnection material layer 42 with a desired shape, the fluidity of the metallic interconnection material is increased upon film deposition. Thus, the film deposition temperature in the second embodiment is set at a relatively high temperature of 300°.

Step 240

Figure 7A:
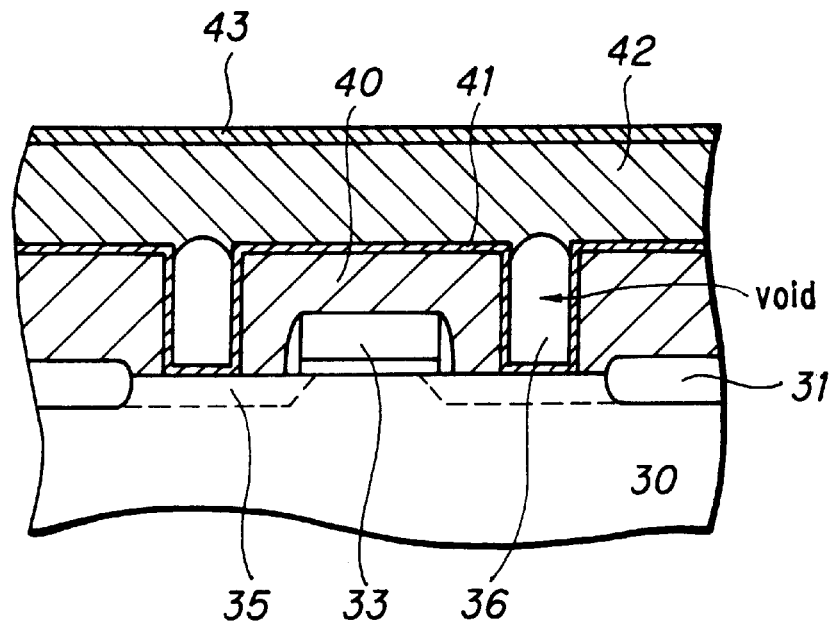
FIGS. 7(A) and 7(B) are a diagram showing the process steps successive to those illustrated in FIGS. 6(A) to 6(C), for fabricating an interconnection for a semiconductor device according to another embodiment of the present invention.
Figure 7B:
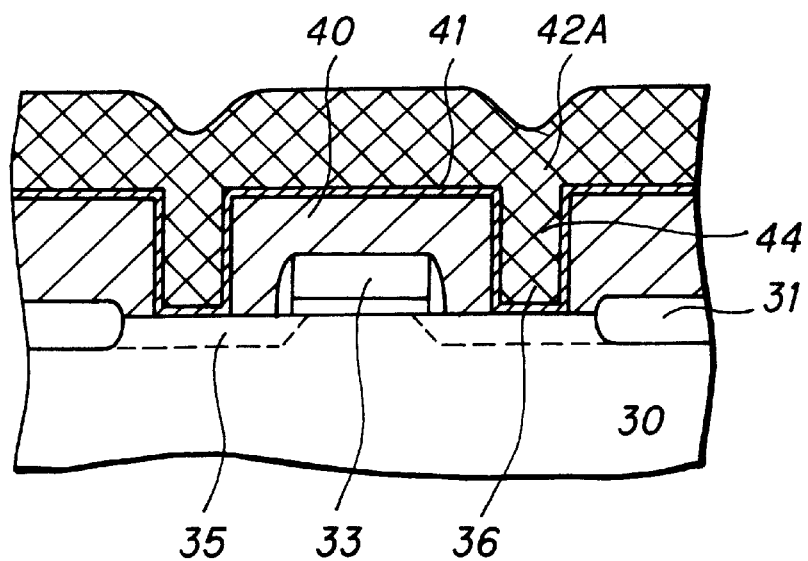

Then, an oxidation preventive film 43 is formed on the metallic interconnection material layer 42 in the same DC sputtering apparatus without exposing the metallic interconnection material layer 42 to air (FIG. 7(A)). Similar to the process described in the first embodiment, the oxidation preventive film 43 consists of a 2 nm thick amorphous silicon, and is deposited under the same conditions as those employed in Step 110 of the first embodiment.

Step 250

The resulting semiconductor substrate is taken out of the sputtering apparatus thereafter, and the semiconductor device (which is actually an intermediate product) is exposed to air. Then, the semiconductor device is placed inside a separate apparatus specially designed for reflow treatment (a furnace, for example) for subjecting the metallic interconnection material layer 42 to reflow treatment to completely dissolve the components constituting the oxidation preventive film 43 into the metallic interconnection material, and to form a connection hole 39 by filling the aperture portion 36 with the metallic interconnection material by subjecting the metallic interconnection material layer 42 to reflow treatment (FIG. 7(B)). It is not necessary to clean the surface of the metallic interconnection material layer 42 by effecting sputter etching and the like prior to reflow treatment. The reflow treatment can be effected, for example, under the same conditions as those employed in Step 120 of the first embodiment. The voids that are present at the bottom of the aperture portion 36 are completely buried by the metallic interconnection material. The metallic interconnection material layer obtained by completely dissolving the components constituting the oxidation preventive film 43 into the metallic interconnection material layer is denoted by the reference numeral 42A.

Step 260

Then, the metallic interconnection material layer 42 and the underlayer that are formed on the insulating layer 40 are patterned by means of photolithography and etching technology in the same manner as in Step 130 of the first embodiment to provide the interconnection layer.

Third Embodiment

The third embodiment relates to a modification of the process described in the second embodiment. The third embodiment differs from the second embodiment in that pure aluminum is used for the metallic interconnection material, that the oxidation preventive film comprises copper, and that the reflow treatment is effected under a high pressure. In the steps of the process for fabricating the interconnection for a semiconductor device according to the embodiment, the steps up to the formation of the barrier metal layer 41 can be performed in the same manner as those effected through Step 200 to Step 220 in the second embodiment. Thus, only the steps that follow these steps are explained below.

Step 300

After forming the barrier metal layer 41, a metallic interconnection material layer 42 comprising pure aluminum is deposited by physical vapor deposition on the insulating layer 40 (FIG. 6(C)). DC sputtering is employed as the method of physical vapor deposition. Prior to the deposition of the metallic interconnection material layer 42, a 20 nm thick Ti underlayer is preferably deposited by means of sputtering on the barrier metal layer 41. Thus, a 0.5 $\mu$m thick metallic interconnection material layer 42 is deposited at a film deposition temperature of 300° C. by DC sputtering at a DC power of 20 kW using an Al target, while flowing 100 sccm of gaseous Ar as the process gas under a pressure of 0.4 Pa.

Figure 1A:
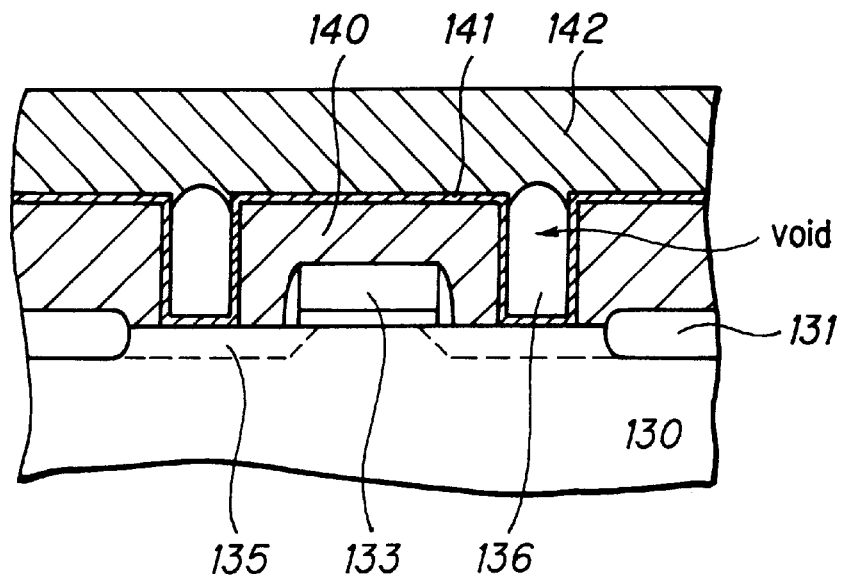
FIGS. 1(A) and 1(B) are an explanatory diagram showing the process of a conventional high temperature reflow treatment.
Figure 1B:
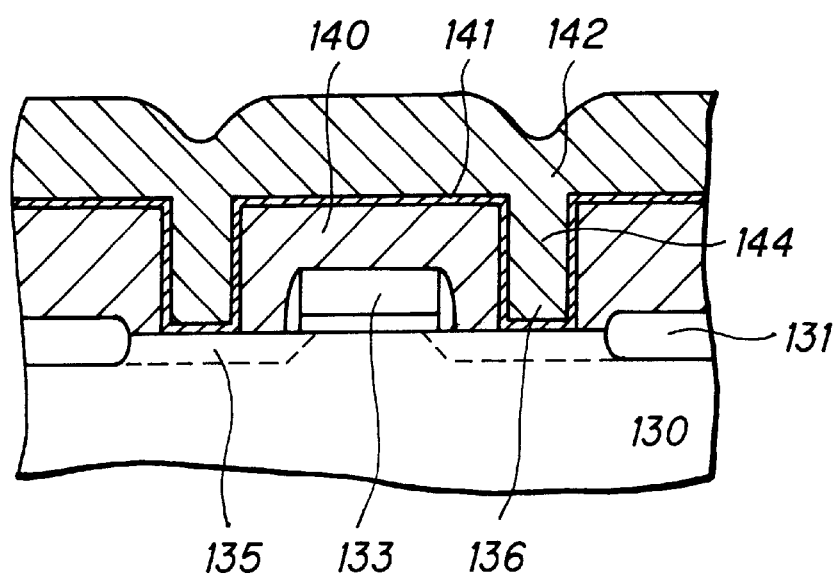
Figure 2:
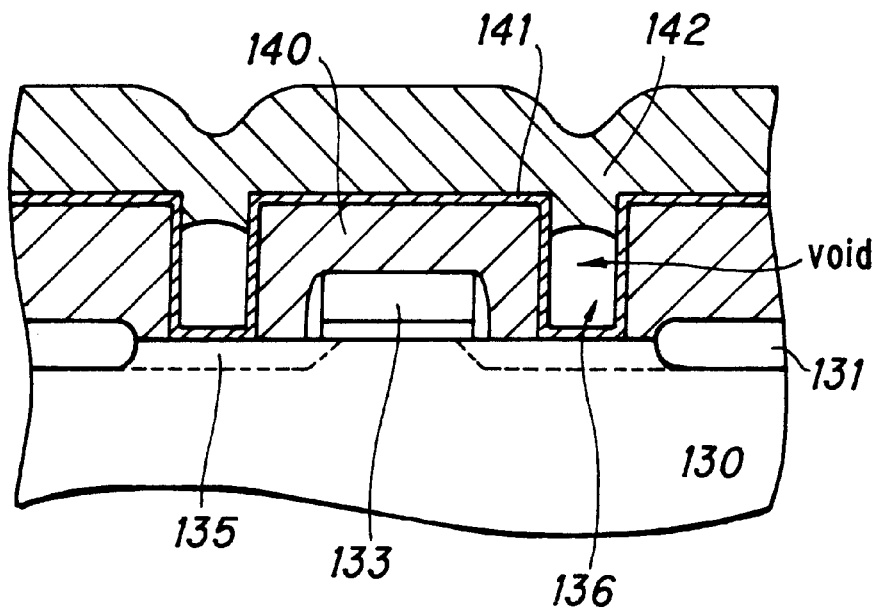
FIG. 2 is an explanatory diagram showing the problems in the process of a conventional high temperature reflow treatment.
Figure 3:
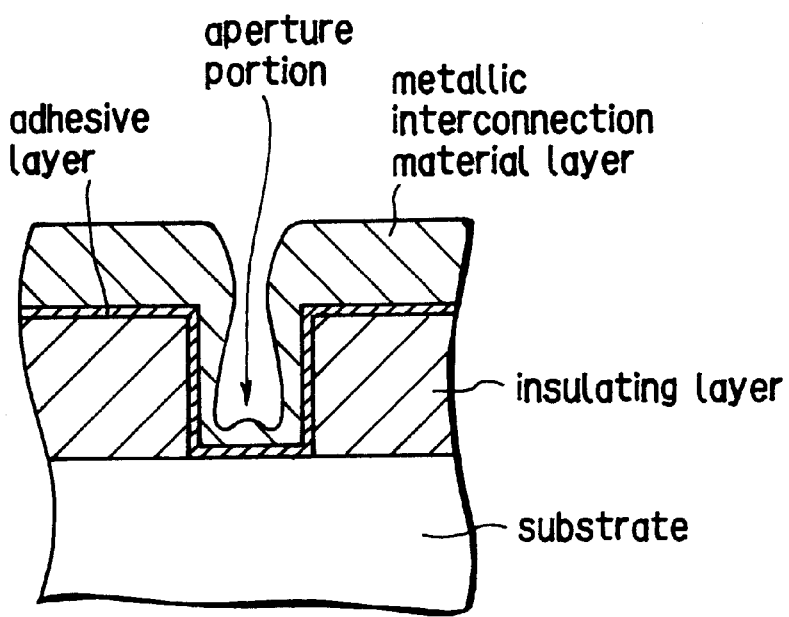
FIG. 3 is a schematic diagram showing the state of a metallic interconnection material in the vicinity of the aperture portion after a film is deposited.

Thus deposited aluminum-based alloy metallic interconnection material layer 42 in the third embodiment must have a bridge-like shape as is shown in FIG. 6(C). Referring to FIG. 3, if the metallic interconnection material should deposit at the bottom of the aperture portion and if a metallic interconnection material is not deposited sufficiently thick on the side wall of the aperture portion, not only does it becomes difficult to deposit an oxidation preventive film on the surface of the metallic interconnection layer inside the aperture portion, but also a sufficient quantity of metallic interconnection material cannot be filled inside the aperture portion. The thus obtained connection hole results in poor reliability. The metallic interconnection material layer 42 with a desired shape can be obtained by increasing the fluidity of the metallic interconnection material upon film deposition. Thus, the film deposition temperature in the third embodiment is also set at a relatively high temperature of 300°.

Step 310

Then, an oxidation preventive film 43 is formed on the metallic interconnection material layer 42 in the same DC sputtering apparatus without exposing the metallic interconnection material layer 42 to air (FIG. 7(A)). The oxidation preventive film 43 in the embodiment differs from that in the second embodiment that a 5 nm thick copper is used. For example, the oxidation preventive film 43 is deposited at a film deposition temperature of 150° C. by applying a DC power of 5 kW, while flowing 100 sccm of gaseous argon at a pressure of 0.4 Pa. The thickness of the copper oxidation preventive film 43 must be a thickness for including quantities of the components constituting the oxidation preventive film 43 completely dissolving into the metallic interconnection material at the reflow temperature to form solid solution by the reflow treatment of the metallic interconnection material layer. In case the reflow temperature is set at 400° C., for instance, the oxidation preventive film 23 is preferably not more than about 1.2% of the thickness of the pure aluminum metallic interconnection material layer 42 (more specifically, for example, the thickness of the oxidation preventive film is not more than 6 nm for a 0.5 $\mu$m thick metallic interconnection material layer 42). The thickness corresponding to about 1.2% of the thickness of the metallic interconnection material layer 42 is the upper limit of the thickness of the oxidation preventive film 43 for completely dissolving the components thereof into the metallic interconnection material when the metallic interconnection material layer 42 is subjected to reflow treatment.

Step 320

The resulting semiconductor substrate is taken out of the sputtering apparatus thereafter, and the semiconductor device (which is actually an intermediate product) is exposed to air. Then, the semiconductor device is placed inside a separate apparatus specially designed for reflow treatment (a furnace, for example) to completely dissolve the components constituting the oxidation preventive film 43 into the metallic interconnection material, and to form a connection hole 39 by filling the aperture portion 36 with the metallic interconnection material by subjecting the metallic interconnection material layer 42 to reflow treatment under a high pressure (FIG. 7(B)). The reflow treatment can be effected, for example, by heating the substrate to 400° C. for a duration of 2 minutes under a gaseous argon atmosphere set at a pressure of $10^8$ Pa or higher. The bridge-like metallic interconnection material layer 42 provided on the upper side of the aperture portion and the metallic interconnection material layer 42 in the vicinity thereof are pushed inward the aperture portion 36 by the pressure applied by the high pressure inert gas, and the voids that are present at the bottom of the aperture portion 36 are completely buried by the metallic interconnection material.

Referring to the phase diagram for Al—Cu system illustrated in FIG. 8(B), the reflow temperature must be set at a temperature not lower than about 380° C., at which 1% of silicon completely dissolves into the aluminum metallic interconnection material to form a solid solution, but not higher than the eutectic point 548° C. at which the metallic interconnection material may partially undergo melting. Similar to the case in the first embodiment, the reflow treatment is preferably effected under a high purity inert gas atmosphere so that the metallic interconnection layer may not be oxidized or nitridized during the treatment.

Step 330

Then, the metallic interconnection material layer 42 and the underlayer provided on the insulating layer 40 are patterned by photolithography and etching to form an interconnection layer in the same manner as in Step 130 described in the first embodiment.

The present invention has been described in detail referring to preferred embodiments, however, the present invention is not only limited thereto. In the embodiments above, the interconnection is formed on the insulating layers 20 or 40. However, the interconnection may be provided by a structure in which, for instance, the interconnection is buried inside a groove portion formed in the insulating layers 20 or 40, by forming an underlayer, a metallic interconnection material layer, and an oxidation preventive film on the insulating layer including such a groove portion, performing reflow treatment, and thereafter removing the metallic interconnection material layer and the underlayer on the insulating layer by means of etching back or chemico-mechanical polishing (CMP).

In the second and third embodiments, the conductive layer 35 comprises source/drain regions. However, the conductive layer 35 may be a lower interconnection layer formed on the lower insulating layer, or a lower interconnection layer provided inside the groove formed in the lower insulating layer.

Furthermore, the oxidation preventive layer can be formed by using, for example, silver or germanium instead of copper or silicon. The phase diagrams for Al—Ag and Al—Ge systems are given in FIGS. 8(C) and 8(D), respectively.

In the embodiments, the insulating layer 20 or 40 is formed from $SiO_2$, however, other known insulating materials such as BPSG, PSG, BSG, AsSG, PbSG, SbSG, SOG, SiON, or SiN can be used. Furthermore, a laminate comprising layers of the materials enumerated above can be used as well. If necessary, the insulating layer 20 or 40 is flattened after forming the insulating layer by means of, preferably, for instance, thermal treatment, chemico-mechanical polishing (CMP), or etching back.

In the embodiments, Ti layers and TiN layers are deposited by sputtering. However, CVD can be used for the film deposition. The metal plug 18 is not only limited to tungsten, and other refractory metal materials or refractory metal compounds, such as copper or TiN, can be used as well. Copper can be deposited by means of CVD, for example, by applying a power of 500 W using a mixed gas flow of $Cu(HFA)_2$ and $H_2$ with respective flow rates of 10 and 1,000 sccm under a pressure of $2.6 \times 10^3$ Pa, while heating the substrate to 350° C., where HFA represents "hexafluoroacetyl acetonate". A TiN layer can be deposited at a temperature of 750° C. by ECR CVD applying a microwave power of 2.8 kW and a substrate RF bias of −50 W, while using a mixed gas flow of $TiCl_4$, $H_2$, and $N_2$ with respective flow rates of 20, 26 and 8 sccm under a pressure of 0.12 Pa. A Ti layer can be deposited at a temperature of 500° C. by ECR CVD applying a microwave power of 2.0 kW, while using a mixed gas flow of $TiCl_4$, $H_2$, and Ar with respective flow rates of 15, 50 and 43 sccm under a pressure of 0.3 Pa.

In addition to Ti, the underlayer can be formed with, an electrically conductive refractory metal such as TiN, TiON, TiW, W, etc., or some combinations thereof.

As described in the foregoing, in the process for fabricating an interconnection for a semiconductor device according to the present invention, an oxidation preventive film that is formed on the metallic interconnection material layer prevents the surface of the metallic interconnection material layer from being oxidized even in case the semiconductor device is once exposed to air. This allows the deposition of the metallic interconnection material layer and the reflow treatment (inclusive of the high pressure reflow treatment) to be performed in separate apparatuses. Furthermore, surface cleaning treatment of the metallic interconnection material layer by means of sputter etching and the like need not be performed before the reflow treatment. As a result, the total cost of the whole process for fabricating the interconnection can be lowered. That is, the reflow treatment inclusive of a high pressure reflow treatment can be effected by using a conventional film deposition apparatus as it is without newly introducing a clustered equipment. Furthermore, because the essential component of the apparatus for the reflow treatment or for the high pressure reflow treatment can be provided only with a thermal treatment component and/or a high pressure treatment component, the entire apparatus can be reduced in cost and is advantageously applied to batch processes. Furthermore, by dissolving the oxidation preventive film into the metallic interconnection material, the reflow temperature is expected to be lowered. In addition, a copper oxidation preventive film provides a more reliable metallic interconnection material layer because copper forms a solid solution with the metallic interconnection material.

While the invention has been described in detail and with reference to specific embodiments thereof, it will be apparent to one skilled in the art that various changes and modifications can be made therein without departing from the spirit and scope thereof.

What is claimed is:

1. A process of fabricating interconnection of a semiconductor device comprising the steps of:

forming a metallic interconnection material layer on a substrate using a metallic interconnection material;

forming an oxidation preventative film on the metallic interconnection material layer;

subjecting the metallic interconnection material layer to reflow treatment to form a solution of the components of the oxidation preventive film with those of the metallic interconnection material layer; and exposing the semiconductor device to air between the step of forming the oxidation protective film on the metallic interconnection material layer and the step of subjecting the metallic interconnection material layer to said reflow treatment.

2. A process for fabricating an interconnection layer on a semiconductor device comprising a metallic interconnection material, said process comprising the steps of:

forming an insulating layer on a substrate, said substrate having a conductive layer provided thereon, and forming an aperture portion in the insulating layer provided on the conductive layer;

forming a metallic interconnection material layer on the insulating layer;

forming an oxidation preventive film on the metallic interconnection material layer;

subjecting the metallic interconnection material layer to reflow treatment to form a solution of the components constituting the oxidation preventive film with those of the metallic interconnection material layer and filling the aperture portion with the metallic interconnection material to form a connection hole; and patterning the complete solid solution to form an interconnection.

3. A process for fabricating interconnection of a semiconductor device as claimed in claim 2, wherein the step of forming the metallic interconnection material layer on the insulating layer is by means of physical vapor deposition and is carried out so that the aperture portion retains a void at a bottom portion thereof and is plugged by the metallic interconnection material layer at an upper portion thereof.

4. A process for fabricating interconnection of a semiconductor device which process provides an interconnection comprising a metallic interconnection material layer and a connection hole filled with metallic interconnection material constituting the metallic interconnection material layer, comprising the steps of:

forming an insulating layer on a substrate having a conductive layer provided thereon, and forming a groove in the insulating layer provided on the conductive layer;

forming a metallic interconnection material layer on the insulating layer;

forming an oxidation preventive film on the metallic interconnection material layer;

subjecting the metallic interconnection material layer to reflow treatment to form a solid solution of the components constituting the oxidation preventive film with those of the metallic interconnection material layer, and filling the groove with the metallic interconnection material to form a connection.

5. A process for fabricating an interconnection of a semiconductor device as claimed in claim 2 or claim 4, further comprising the step of:

exposing the semiconductor device to air between the step of forming said oxidation protective film on the metallic interconnection material layer and the step of subjecting said metallic interconnection material layer to said reflow treatment.

6. A process for fabricating an interconnection of a semiconductor device as claimed in claim 1, claim 2 or claim 4, wherein the oxidation preventive film is made of a material which is resistant to forming a tough oxide film at room temperature, and is provided with a film thickness sufficient to form said solid solution by the reflow treatment with said metallic interconnection material layer.

7. A process for fabricating an interconnection of a semiconductor device as claimed in claim 1, claim 2 or claim 4, wherein the oxidation preventive film comprises a material selected from the group consisting of silver, copper, silicon, and germanium.

8. A process for fabricating interconnection of a semiconductor device as claimed in claim 1, claim 2 or claim 4, wherein the metallic interconnection material comprises aluminum, copper, or an Al alloy including Al—Cu alloy, an Al—Si alloy, an Al—Si—Cu alloy, an Al—Ge alloy, and an Al—Si—Ge alloy.

9. A process for fabricating interconnection of a semiconductor device as claimed in claim 1, claim 2 or claim 4, wherein said oxidation preventive film has a thickness about 0.5% of a thickness of said metallic interconnection material layer.

* * * * *